United States Patent
Marasch et al.

(10) Patent No.: US 6,759,840 B2
(45) Date of Patent: Jul. 6, 2004

(54) HALL EFFECT CONDUCTOR/CORE METHOD AND APPARATUS

(75) Inventors: Richard Marasch, Germantown, WI (US); Jeff Annis, Waukesha, WI (US); Bob Rushmer, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 64 days.

(21) Appl. No.: 10/166,922

(22) Filed: Jun. 11, 2002

(65) Prior Publication Data

US 2003/0227284 A1 Dec. 11, 2003

(51) Int. Cl.[7] .............................................. G01R 33/00
(52) U.S. Cl. ............................. 324/117 H; 324/117 R; 324/127
(58) Field of Search ................................. 324/126–127, 324/117 R, 117 H, 130, 133, 142

(56) References Cited

U.S. PATENT DOCUMENTS

| 5,017,859 | A | * | 5/1991 | Engel et al. ............... 324/127 |
| 5,160,970 | A | | 11/1992 | Isogai |
| 5,552,700 | A | | 9/1996 | Tanabe et al. |
| 6,005,383 | A | | 12/1999 | Savary et al. |
| 6,417,661 | B1 | * | 7/2002 | Berkcan et al. ......... 324/117 R |
| 6,426,617 | B1 | | 7/2002 | Haensgen et al. |
| 6,429,639 | B1 | | 8/2002 | Pelly |
| 6,566,856 | B2 | | 5/2003 | Sandquist et al. |

\* cited by examiner

*Primary Examiner*—Minh N. Tang
(74) *Attorney, Agent, or Firm*—Quarles & Brady LLP; Alexander M. Gerasimow (57) ABSTRACT

A method and apparatus for configuring a current carrying and current sensing configuration using a rigid magnetically permeable guide core extending between facing first and second guide ends, the first and second ends of the core defining a sensing gap having a sensing dimension therebetween, an internal surface of the core forming a core space, the method including sliding a segment of a conductor through the sensing gap and into the core space such that the conductor extends through the core space, attaching a flux sensor to a clip member and mounting the clip member within the sensing space such that the sensor is within the sensing space.

20 Claims, 10 Drawing Sheets

HALL EFFECT CONDUCTOR/CORE METHOD AND APPARATUS

STATEMENT REGARDING FEDERALLY SPONSORED RESEARCH OR DEVELOPMENT

Not applicable.

BACKGROUND OF THE INVENTION

The field of the invention is Hall effect current sensors and more specifically methods and apparatus for mounting a magnetic field sensor within a gap formed by a core or flux guide that surrounds a conductor.

When current passes through a conductor, the current generates a magnetic field including flux that encircles the conductor and that is directed along flux lines in a direction consistent with the well known right hand rule. The field strength is strongest at locations in close proximity to the conductor. The magnitude of current passing through the conductor is directly proportional to the total strength of the magnetic field generated thereby. Thus, if the magnetic flux generated by the current can be accurately determined, then the magnitude of the current passing through that conductor can also be determined.

One way to determine the magnetic flux and hence conductor current has been to design a sensor configuration that relies upon the well known Hall effect electromagnetic principle. To this end, in 1879, Edwin Hall discovered that equal-potential lines in a current carrying conductor are skewed when put in the presence of a magnetic field. This effect was observed as a voltage (Hall voltage) perpendicular to the direction of current flow. Today, Hall effect devices for measuring the Hall voltage and hence a corresponding magnetic field are packaged as single Hall effect chips and are sold as high volume commodity items.

A typical current sensor utilizing Hall effect technology consists of a toroid or rectangular shaped gapped core and a Hall effect chip. Exemplary cores typically include either a laminated stack or a high resistivity solid ferrite material designed to prevent unwanted eddy currents. A single current carrying conductor is positioned within the core such that the permeable core directs the magnetic flux through the core and across the gap. A Hall effect chip is placed within the gap to sense the flux density passing there across. In a well-designed Hall effect current sensor, the measured flux density is linear and directly proportional to the current flowing through the current carrying conductor.

One design challenge routinely faced when designing Hall effect sensors has been finding a cost effective and mechanically robust way in which to mount the Hall effect chip within a core gap. One other challenge has been to configure a sensor that has a relatively small volume footprint. With respect to cost, as with most mechanical products, minimal piece count, less and simplified manufacturing steps and less manufacturing time are all advantageous. In addition, smaller components size typically translates into reduced costs. With respect to robustness, many Hall effect sensors are designed to be employed in rugged environments such as industrial control applications where shock and vibration are routine.

The industry has devised several Hall effect sensor configurations. For instance, in one configuration, a donut shaped and gapped ferrite core is positioned over a vertically mounted Hall effect chip which is soldered to a circuit board. In this case the ferrite core is typically manually positioned with respect to the chip and is then glued to the circuit board. While this solution can be used to provide a robust sensor configuration, this solution has several shortcomings. First, sensor manufacturing experience has revealed that it is relatively difficult to accurately position and glue a donut shaped core relative to the circuit board mounted Hall effect chip. Also, in this regard, where the sensor is subjected to vibrations and shock, any loosening or shifting of the bond between the core and board can compromise the accuracy of the current sensor.

Second, the manual labor to glue a core to a board is not very efficient or cost effective and the glue curing cycle is typically relatively long. Labor and curing costs increase the overall costs associated with providing these types of Hall effect current sensors.

One other approach to mounting a Hall effect chip within a core gap has been to mount the chip on a board, position the core in a housing cavity with the circuit board mounted chip appropriately juxtaposed within the gap, fill the cavity with epoxy potting compound and bake the filled housing for several hours to completely cure the epoxy. As in the case of the glued donut shaped core, the manual labor required to pot the core and board is relatively expensive. Moreover, the baking time required to cure the epoxy reduces manufacturing throughput. Furthermore, the requirement for a housing increases parts count and hence overall configuration costs.

Yet one other approach to mounting a Hall effect chip within a core gap has been to mount a circuit board within a bobbin and mount a Hall effect chip to the circuit board where right angle pin connectors from the chip protrude out of apertures in the bobbin for connection to one or more other circuit boards. A core lamination stack is inserted into the bobbin with the bobbin formed to arrange the core and chip with respect to each other such that the chip is within the gap. Thereafter, the bobbin, core, chip and board are inserted into a first piece of a housing with the pin connectors protruding out housing apertures and a second housing piece is snapped together with the first piece to secure all of the components inside. The housed configuration forms a complete Hall effect current sensor.

This solution, unfortunately, requires a relatively large number of components and therefore increases costs appreciably. In addition, the pin connectors used with this type of assembly are relatively flimsy and have been known to break when used in typical industrial environments. Moreover, the pin connectors are often bent prior to installation or may be located imperfectly and therefore make installation relatively difficult. Furthermore, if the laminations are not clamped tightly by the housing, the laminations may shift laterally or rotate within the housing due to shock or vibrations. Such shifting and rotation will often result in changing the size of the core gap which alters the sensitivity of the sensor configuration.

One constraint on core size is the required dimensions of the conductor that passes through the core. To this end, conductors are typically selected based on the expected maximum steady state current passing through the conductors to ensure that heat generated by $I^2R$ losses or eddy currents does not cause the conductor temperature to exceed maximum limits defined by UL or IEC specifications. Heat generated by conductor $I^2R$ losses varies inversely with conductor cross-sectional area and with the square of current. Therefore, if conductor temperature is to be maintained, doubling the current requires a conductor with four times the original cross-sectional area.

In addition to current considerations, one other factor that may dictate conductor characteristics is the type of application in which the conductor is employed. For instance, in some applications a conductor may form a bus bar where ends of the bus bar have to have certain dimensions in order to facilitate hookup of other components via common size terminal lugs and mounting hardware that conforms with industry standards.

In some soft motor control (SMC) modular applications (e.g., high amp power pole sub-assemblies), bus bars are designed to minimize $I^2R$ have the largest area possible to facilitate maximum heat dissipation. For instance, where a module footprint is twelve inches by two inches, the bus bar may be designed to be thirteen inches long and two inches wide, the additional inch in length provided so that the bar extends from a module housing for linking to other system components. In such a case the core of a hall effect current sensor must have dimensions that can accommodate the required bus bar width. Thus, in the case of a torroidal core the core diameter would have to be greater than two inches to accommodate the bus bar therein.

Unfortunately, in the example above where the module footprint is twelve by two inches, if a core is provided about the bus bar, the core will exceed the module footprint. For instance, assume a core having side or annular members that are ¼ inch thick. In this case, the core about the bus bar would exceed the footprint by ½ inch along the width dimension (i.e., ¼ inch on either side of the width). A couple of ways to deal with this problem would be to increase the module footprint, reduce current levels in the bus bars or change the bar cross-section to square versus rectangular. Unfortunately all of these options severely compromise product size, ease of using standard termination lugs or mounting hardware and limit maximum optimal current levels.

A commonly owned patent application filed on even date herewith which is entitled "Snap Fit Hall Effect Circuit Mount Apparatus and Method" teaches one assembly that addresses many of the problems discusses above. To this end, the snap fit concepts in this reference teach a sensor mounted to a resilient clip member where the clip member is securely mountable within a core sensing gap such that the sensor is positioned substantially within the sensing gap. Thus, this solution addresses the problems discussed above with respect to mounting a sensor within a core gap by providing an inexpensive, low-parts count and simple to manufacture and configure assembly. Unfortunately, this solution does not address the other problems discussed above and related to accommodating a bus bar width and core in a relatively small area (e.g., within a small width footprint).

Therefore, it would be advantageous to have a simple and inexpensive solution for accommodating a bus bar width and core in a small width footprint without reducing current ratings for the bar or increasing size of the product.

BRIEF SUMMARY OF THE INVENTION

It has been recognized that a bus bar can be notched along a relatively short segment thereof and on either side such that the notched section and members of a core there around together are within a maximum dimension corresponding to a configuration footprint. In this manner, the wider portions of the bus bar operate as a heat sink for the notched segment and other bar segments and current rating is relatively unaffected. It has also been recognized that by configuring the core so as to have specific dimensions relative to the bus bar the overall size of the bar and core can be minimized and a simple method is facilitated for positioning the core and bar with respect to each other. To this end, generally, the core is formed such that a gap formed thereby is wider than the notched portion of the bus bar and a core space defined by an internal surface of the core is sized to receive the notched core segment so that the notched segment can be manipulated through the gap and into the core space.

Consistent with the above description, the present invention includes an apparatus for passing current and sensing magnetic field flux formed by the current, the apparatus comprising a current conductor having a length that extends between first and second conductor ends and first and second edges that extend substantially along the entire conductor length, the edges forming first and second notches at a central conductor segment such that the central segment has a central width dimension that is less than the width dimensions of conductor segments adjacent thereto and a rigid magnetically permeable guide core extending between facing first and second core ends and an internal surface formed about a core space, the first and second core ends defining a sensing gap having a gap dimension therebetween that is greater than the conductor thickness and less than the conductor width, the core including first and second member segments on opposite sides of the core space, wherein the central conductor segment is moveable through the gap and substantially into the core space with the conductor width aligned substantially perpendicular to the gap dimension and the core space is configured to allow the conductor, once substantially in the core space, to be moved into an operating position with the second member segment passing at least partially through the second notch and one of the first member segment and the gap passing at least partially through the first notch.

The invention also includes a method for passing current and sensing magnetic field flux formed by the current, the method comprising the steps of providing a current conductor having a length that extends between first and second conductor ends and first and second edges that extend substantially along the entire conductor length, the edges forming first and second notches at a central conductor segment such that the central segment has a central width dimension that is less than the width dimensions of conductor segments adjacent thereto, providing a rigid magnetically permeable guide core extending between facing first and second core ends and an internal surface formed about a core space, the first and second core ends defining a sensing gap having a gap dimension therebetween that is greater than the conductor thickness and less than the conductor width, the core including first and second member segments on opposite sides of the core space, moving the central conductor segment through the gap and substantially into the core space with the conductor width aligned substantially perpendicular to the gap dimension and moving the central segment into an operating position with the second member segment passing at least partially through the second notch and one of the first member segment and the gap passing at least partially through the first notch.

These and other aspects of the invention will become apparent from the following description. In the description, reference is made to the accompanying drawings which form a part hereof, and in which there is shown a preferred embodiment of the invention. Such embodiment does not necessarily represent the full scope of the invention and reference is made therefore, to the claims herein for interpreting the scope of the invention.

DETAILED DESCRIPTION OF THE INVENTION

Referring now to the drawings and, more specifically referring to FIGS. 1 through 12, a first embodiment 10 of the present invention includes, generally, a permeable guide core 12, a sensor assembly 60 and a bus bar 122. Core 12 includes a plurality of metallic laminations stacked together to form a substantially "C" shaped core having parallel first and second arm members 16 and 20 (also referred to as first and second member segments), a substantially elongated and straight shoulder member 18 that traverses the distance between adjacent ends of parallel members 16 and 20 (i.e., members 16 and 20 extend in the same direction from opposite ends of member 18 to distal ends) and relatively shorter first and second finger members 14 and 22 that extend from ends of members 16 and 20 opposite member 18 and toward each other and generally form a gap 13. Members 14 and 22 terminate at distal and facing first and second core ends 25 and 27, respectively, that form a gap therebetween. Members 14, 16, 18, 20 and 22 together form a core having an internal surface (100, 101, 102 land 103 in FIG. 5) that defines a core space 26. As seen best in FIG. 7, when in an operating position conductor 122 is positioned so as to pass through space 26. Core 14 is characterized by a core thickness $C_t$ (see FIG. 6) that corresponds to the combined thickness of the laminates used to construct core 12.

Figure 1:
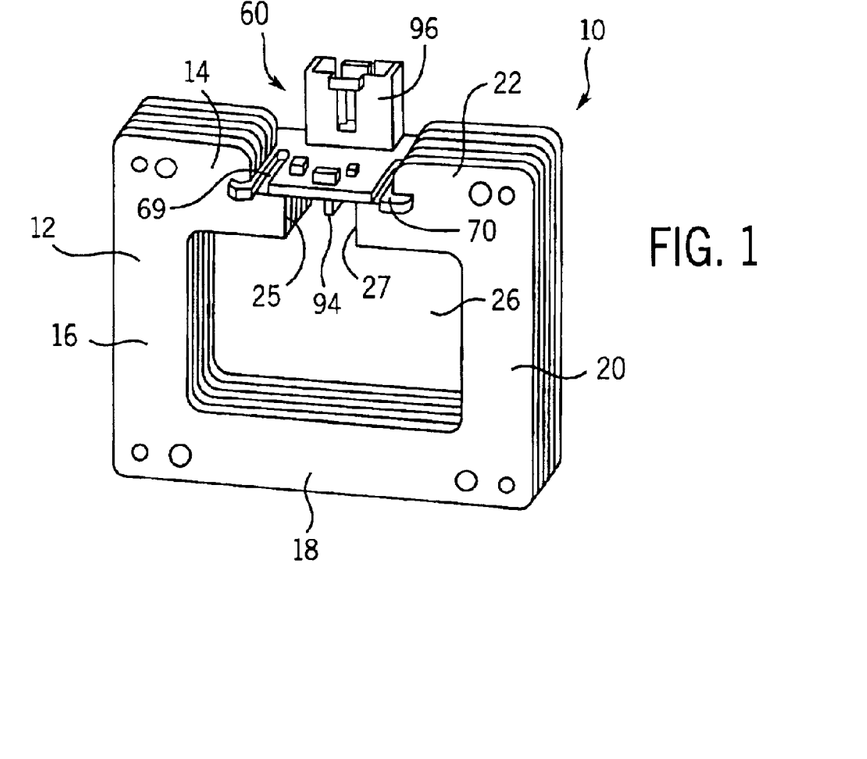
FIG. 1 is a perspective view of a first Hall effect type current sensor embodiment.
Figure 5:
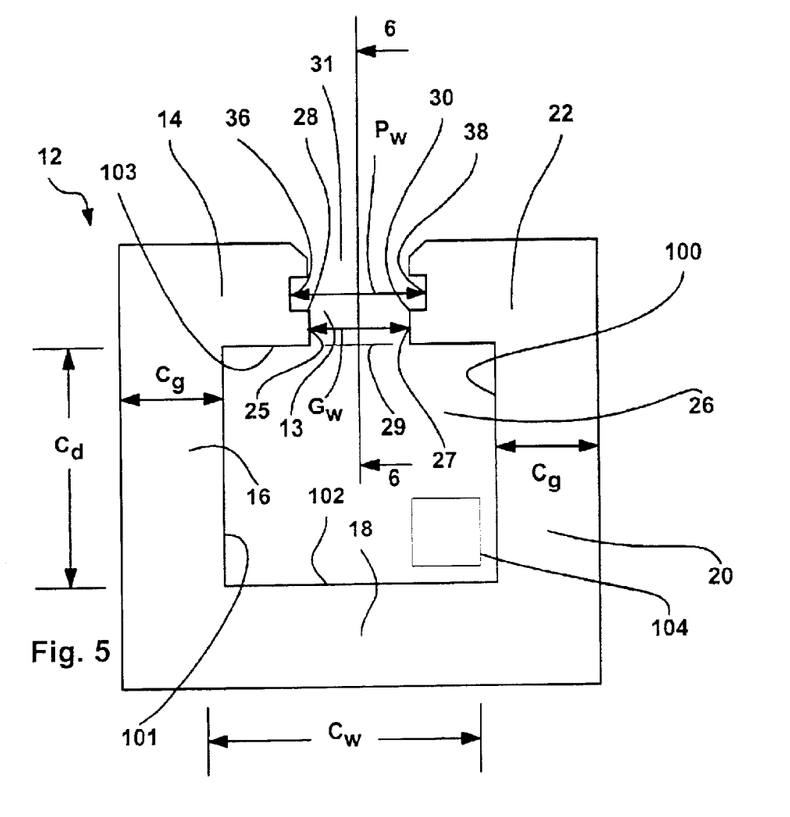
FIG. 5 is a side elevational view of the guide core of FIG. 1.
Figure 6:
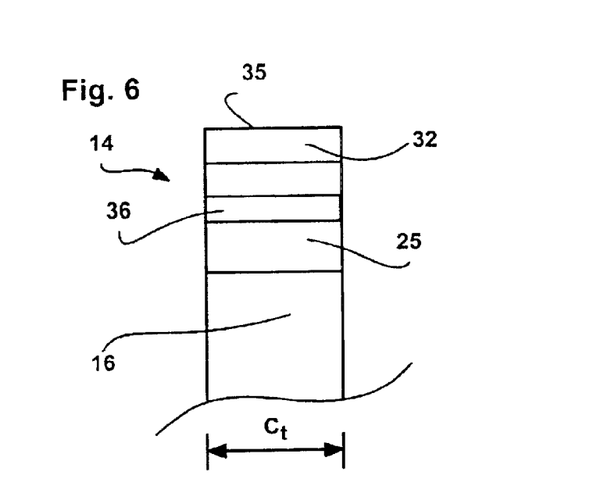
FIG. 6 is a partial view of one end of the core of FIG. 5 taken along the lines 6—6.

Referring specifically to FIGS. 1 and 5, first and second passageways or recesses 28 and 30 are formed in the first and second ends 25 and 27, respectively, such that the passageways 28 and 30 form substantially parallel and oppositely facing elongate internal surfaces 36 and 38, respectively. Each of the internal surfaces 36 and 38 extends generally across the thickness Ct (see FIG. 6 again) of a corresponding end (e.g., 25, 27). The facing internal surfaces 36 and 38 generally define a space having a passageway width $P_w$. The space between ends 25 and 27 that is bounded on one side by the conductor core space 26 and bounded on the other side by passageways 28 and 30 will be referred to hereinafter as a sensor core space 29 having a gap width $G_w$. The space between ends 25 and 27 and on a side of passageways 28 and 30 opposite sensor core space 29 will be referred to hereinafter as a circuit core space 31. Space 31 is illustrated as having the same width $G_w$ as space 29 although this is not a requirement of the invention. As illustrated, gap width $G_w$ is less than passageway width $P_w$. The dimension between passageways 28 and 30 and space 26 must be large enough to accommodate flux sensor 94 when assembly 60 is mounted as illustrated in FIG. 1.

Referring still to FIG. 5, a limit surface 102 formed by the internal surface of shoulder member 18 on a side of core space 26 opposite sensing space 29 and the internal surfaces corresponding to finger members 14 and 22 (e.g., internal surface 103) define a core depth Cd that is also defined by the boundary of space 29 that is flush with surface 103 and limit surface 102. In addition, facing first and second internal surface segments 101 and 100 define a core width $C_w$. A pivot space 104 is located along surface 102 adjacent surface 100. Space 104 will be described in greater detail below. Each of arm members 16 and 20 has a core girth dimension $C_g$ parallel to the gap width $G_w$.

Referring again to FIGS. 1 through 4, assembly 60 includes a clip member 51, a plug receiving socket 96, circuit components 100 and a flux sensor 94. Clip member 51 is a substantially flat and relatively thin lightweight member which is typically formed of some type of circuit board material. Member 51 is generally rectangularly shaped and forms first and second oppositely facing edges 64 and 66 and third and fourth oppositely facing edges 76 and 78 and has first and second oppositely facing sides 92 and 98, respectively. First side 92 of member 51 is formed in any manner well known in the art for mounting sensor 94 via soldering or some other mounting process. Similarly, second side 98 is constructed and designed to receive various circuit components 100 and also to receive plug socket 96 which, as its label implies, is configured to receive a plug for linking sensor 94 and other circuit components 100 to other circuitry. Sensor 94 and components 100 are operably linked via circuit board runs to socket 96. In at least one embodiment clip member 51 extends laterally such that when placed within the gap between ends 25 and 27, a portion is laterally outside the gap. Here, socket 96 (see FIG. 1) may be mounted to the laterally extending portion so that plug 96 resides outside the gap.

Figure 2:
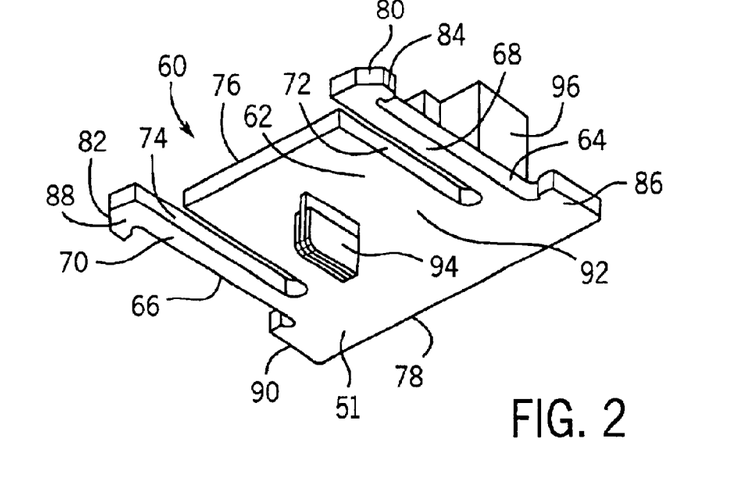
FIG. 2 is a perspective view of the clip assembly illustrated in FIG. 1.
Figure 3:
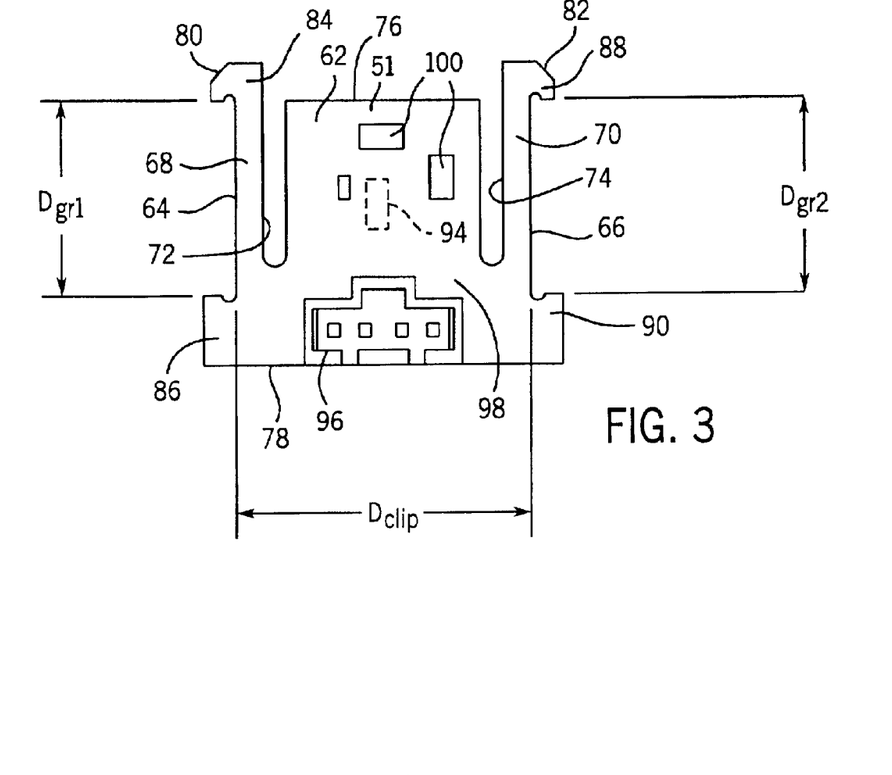
FIG. 3 is a top plan view of the clip assembly of FIG. 2.
Figure 4:
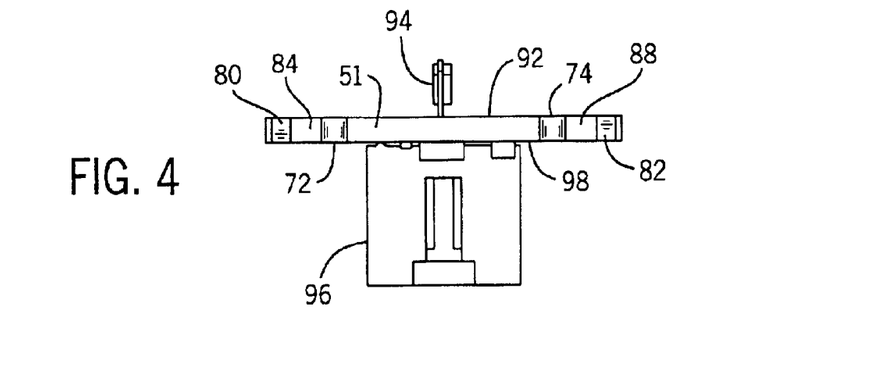
FIG. 4 is a side plan view of the clip assembly illustrated in FIG. 2.

Clip member 51 forms first and second elongate slots 72 and 74 that are substantially parallel to edges 64 and 66, respectively, that are closed proximate fourth edge 78 and that are open proximate third edge 76. With slots 72 and 74 formed as described above, in effect, first and second leg members 68 and 70 are formed that are separated from a body member 62 where leg members 68 and 70 are generally resiliently flexible so that they can be temporarily deformed by pushing inwardly on the distal ends thereof. Hereinafter, the ends of leg members 68 and 70 that are connected proximate fourth edge 78 to body member 62 will be referred to as proximal ends and the unconnected ends of leg members 68 and 70 proximate third edge 76 will be referred to as distal ends.

Referring still to FIGS. 2, 3 and 4, first and second restraining members 84 and 86 extend laterally from the distal and proximal ends of leg member 68 in a direction away from leg member 70. Similarly, third and fourth restraining members 88 and 90, respectively, extend laterally and in the same direction from the distal and proximal ends of leg member 70 in a direction away from first leg member 68. First and second restraining members 84 and 86 have facing surfaces that define a first guide receiving dimension $D_{gr1}$ where dimension $D_{gr1}$ is substantially equal to or slightly greater than the guide thickness $T_g$ (see FIG. 6). Similarly, third and fourth restraining members 88 and 90 form facing surfaces that define a second guide receiving dimension $D_{gr2}$ where dimension $D_{gr2}$ is substantially similar to guide thickness $T_g$. Moreover, referring still to FIG. 3, clip member 51 is dimensioned such that edges 64 and 66 define a clip dimension $D_{clip}$ substantially equal to the gap dimension $D_g$ illustrated in FIG. 5. In the embodiment illustrated, the distal ends of leg members 68 and 70 are tapered toward each other so as to form sloped bearing surfaces 80 and 82 which help to facilitate temporary deformation during insertion of member 51 between core ends 25 and 27.

With the core 12 and clip assembly 60 configured in the manner described above with sensor 94 mounted to first side 92, assembly 60 can be attached within the gap between ends 25 and 27 in the following manner. First, clip member 51 is aligned such that bearing surfaces 80 and 82 are proximate internal surfaces 36 and 38 and, in fact, bear there against. In this case, the edges of surfaces 36 and 38 that surfaces 80 and 82 bear against operate as core bearing surfaces. With clip member 51 so aligned, clip member 51 is forced along a trajectory parallel with passageways 28 and 30 such that force is applied against bearing surfaces 80 and 82 causing leg members 68 and 70 to temporarily flex or deform inwardly toward each other. Eventually, leg members 68 and 70 flex inwardly to the point where restraining members 84 and 88 are forced into and along passageways 28 and 30. Eventually, restraining members 84 and 88 are forced to the opposite ends of passageways 28 and 30 and extend therefrom. At this point, the deforming force against bearing surfaces 80 and 82 ceases and leg members 68 and 70 resiliently spring back to their original configurations. In this case, edges 64 and 66 are received within passageways 28 and 30 such that restraining members 84 and 86 and 88 and 90 maintain clip assembly 60 within the sensing gap.

Figure 7:
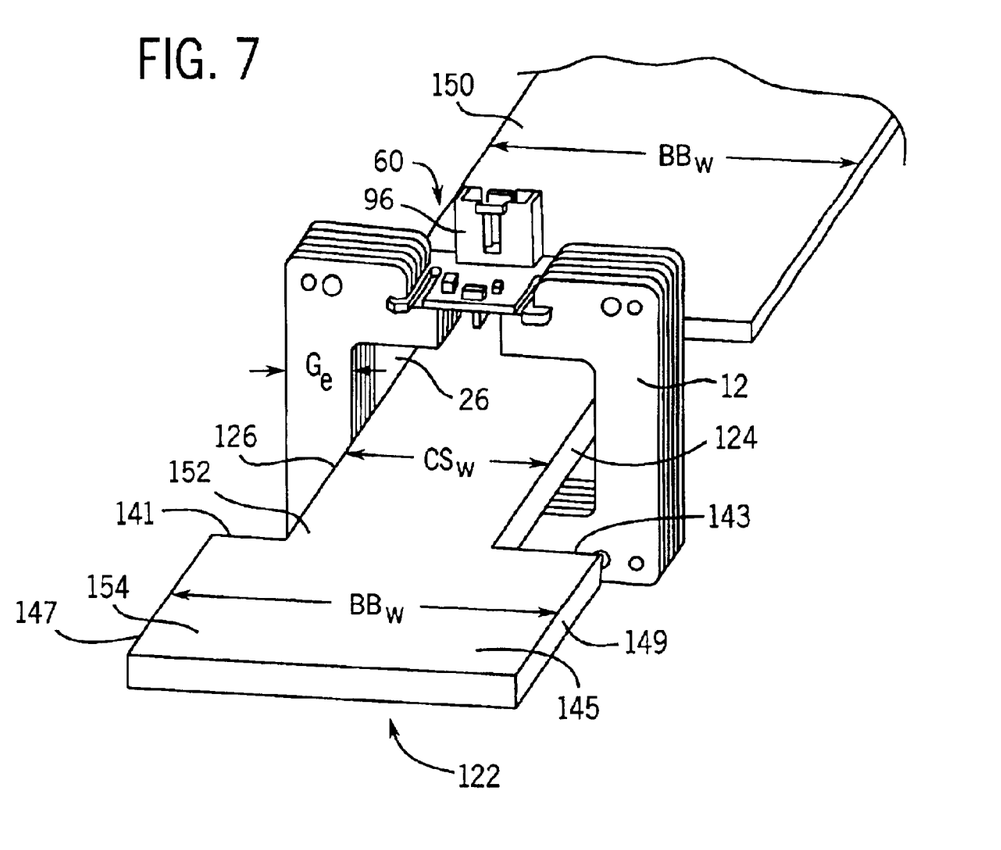
FIG. 7 is a perspective view of a bus bar installed in an operating position relative to the core and sensing assembly of FIG. 1.
Figure 8:
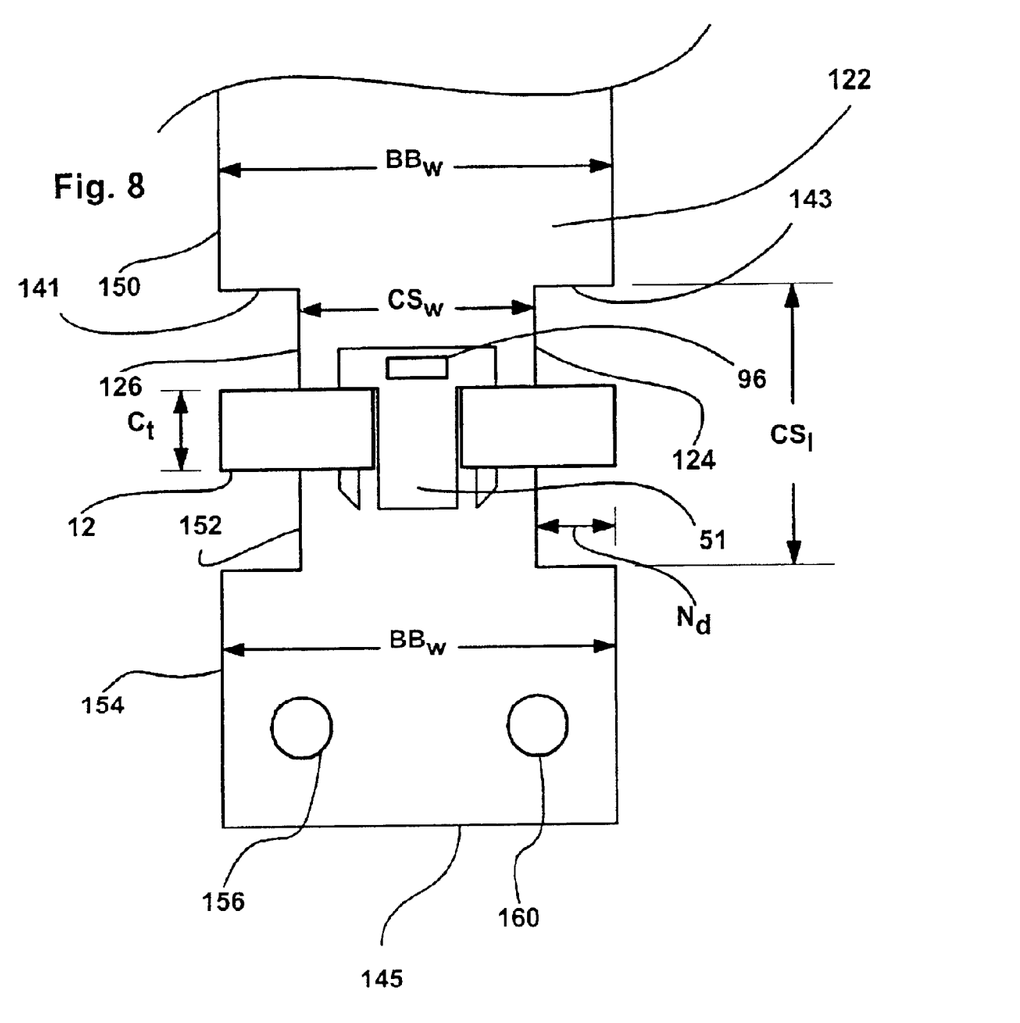
FIG. 8 is a schematic top plan view of the assembly of FIG. 7.
Figure 9:
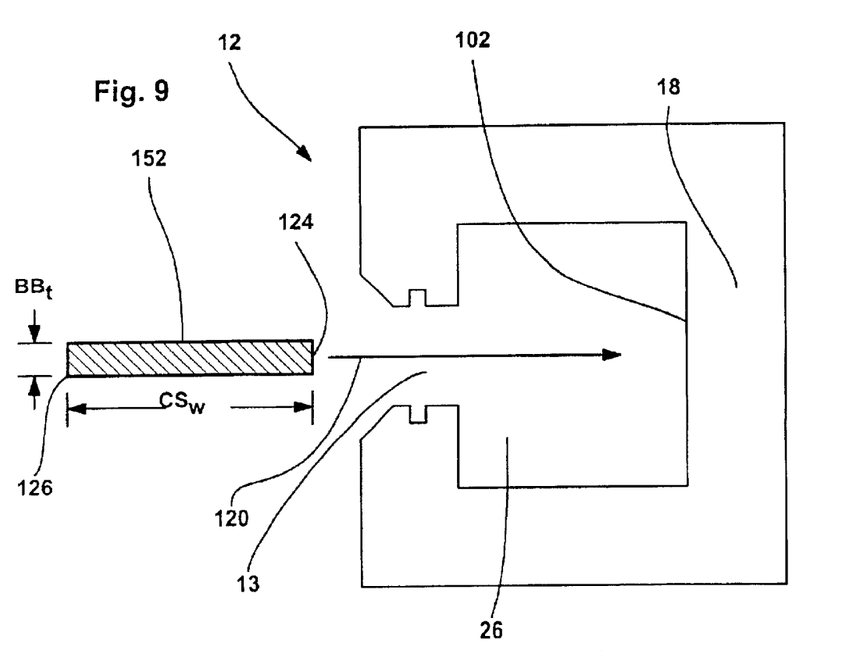
FIG. 9 is a side plan view illustrating one step in a method according to the present invention.
Figure 10:
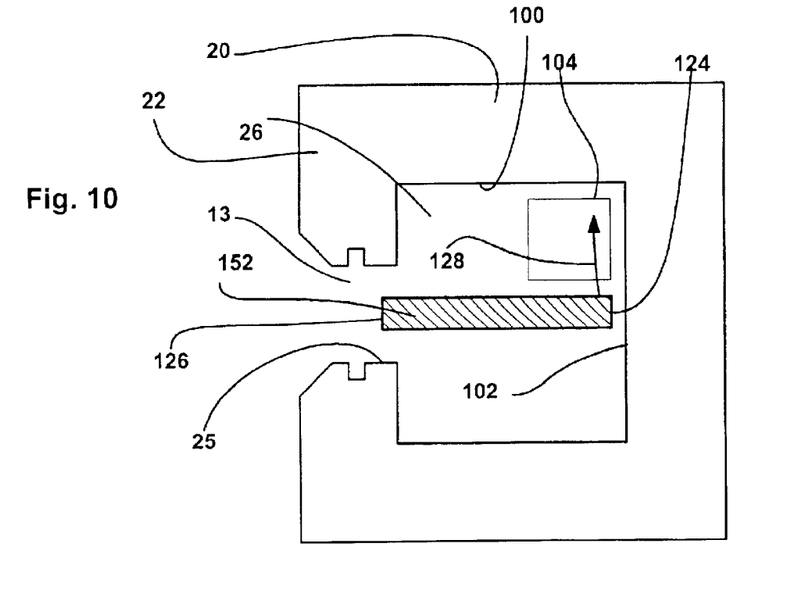
FIG. 10 is similar to FIG. 9, albeit illustrating another step in an inventive method.

Referring now to FIGS. 7, 8 and 9, bus bar 122 (i.e., a conductor) is an elongated metallic member that extends between first and second ends (only first end 145 illustrated). Bar 122 generally has oppositely facing and parallel lateral edges 147 and 149 and, in the illustrated embodiment, has a constant bus bar or conductor thickness $BB_t$ that is less than the smallest dimension within gap 13 (i.e., less than dimension $G_w$). Proximate end 145 bar 122 forms first and second notches 141 and 143 in edges 147 and 149, respectively. Each notch 141 and 143 is similarly shaped and is rectangular so that a central segment 152 is formed in bar 122 that has a smaller width dimension $CS_w$ than adjacent first and second bar end segments 150 and 154, respectively. Thus, as illustrated, each of end segments 154 and 150 have a width dimensions $BB_w$ while central segment 152 has a relatively smaller width dimension $CS_w$. In at least some embodiments widths corresponding to end segments 150 and 154 may be different. More specifically, in at least some embodiments each notch 141 and 143 has a depth $N_d$ (see FIG. 8) that is similar to or slightly greater than the arm member girth $C_g$ (see FIG. 5).

Importantly, central segment width $CS_w$ and end segment width $BB_w$ are related to dimensions of core 12. More specifically, end segment width $BB_w$ is substantially similar to the combination of core width $C_w$ (see FIG. 5) and the girths $C_g$ of both arm members 16 and 20 (i.e., $BB_w=C_w+2C_g$). In addition, central segment width $CS_w$ is slightly less than core width $C_w$. Moreover, the internal surface of core 12 is formed between the gap 13 and the space occupied by the central segment 152 when in the operating position such that the central segment 152 can be manipulated in some fashion from within the gap into the operating position. Several manipulating processes are described herein but others are contemplated.

Furthermore, notches 141 and 143 extend along a central segment length $CS_l$ where, at least in some embodiments, length $CS_l$ is several (e.g., two or more) times as long as core thickness $C_t$. This limitation helps to ensure current is generally passing through central segment 152 parallel to length $CS_l$ when the current passes through a core 12 that is positioned approximately half-way along length $CS_l$ (see FIG. 8).

Referring to FIGS. 7 and 8, the above described relative dimensions facilitate the juxtaposition illustrated where the central segment width $CS_w$ can be aligned with the core width $C_w$ with arm members 16 and 20 completely received in and passing through the spaces defined by notches 141 and 143. Thus, the combined width of central segment 152 and core 12 is similar to the width $BB_w$ of end bar segments 154 and 150 and a conductor/sensor configuration results that has a footprint that need not be enlarged to accommodate the core.

Figure 13:
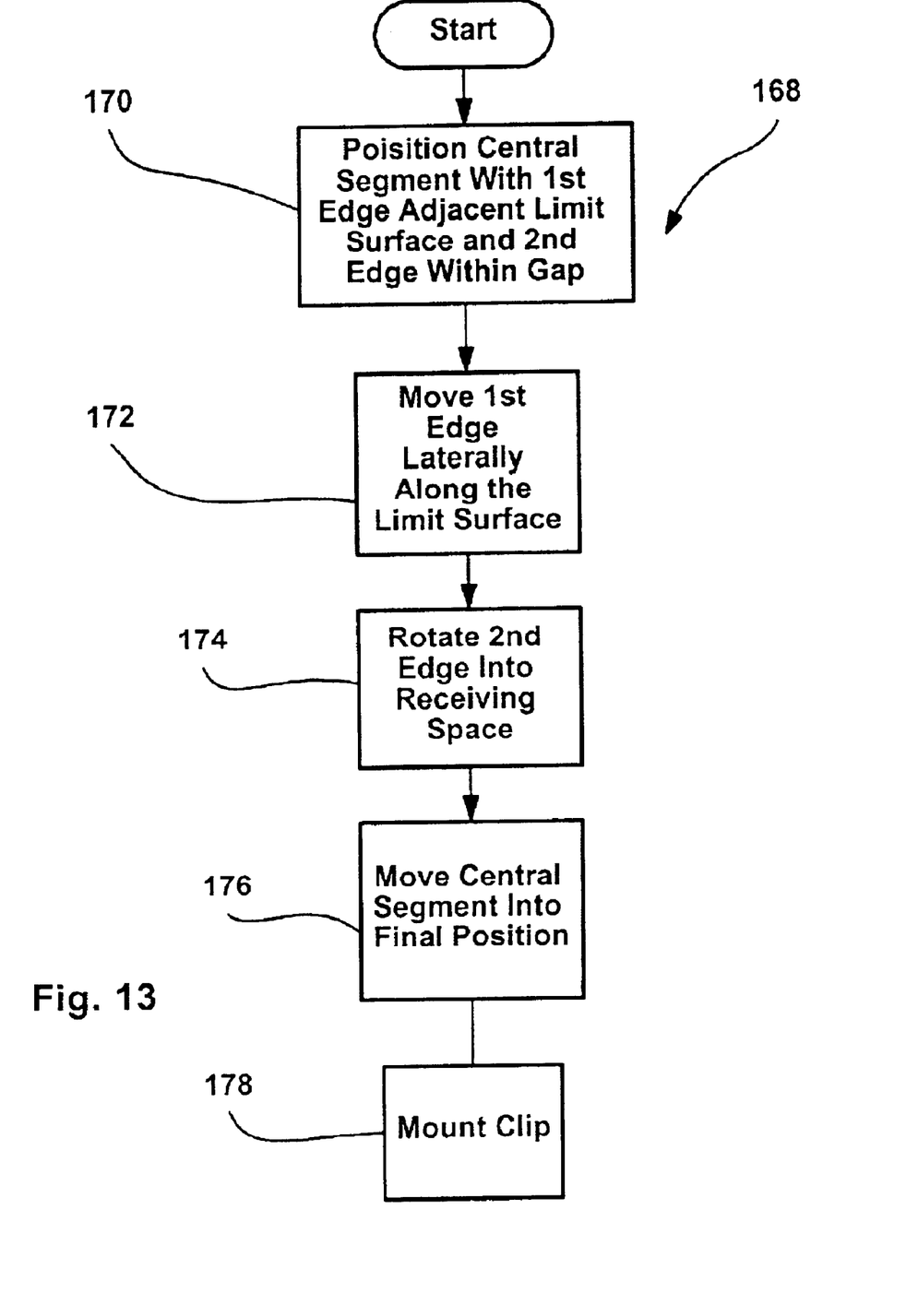
FIG. 13 is a flow chart illustrating an inventive method.

Referring to FIG. 13, one inventive method 168 according to the present invention is illustrated. Referring also to FIG. 9, at process block 170, the central segment 152 of bar 122 is moved either along the trajectory indicated by arrow 120 or in some other manner into the position illustrated in FIG. 10 where the first edge 124 of segment 152 is adjacent limit surface 102 of shoulder member 18 with the second edge 126 of segment 152 located within gap 13. Next, referring also to FIGS. 11 and 13, at block 172, first edge 124 is moved laterally along limit surface 102 toward surface 100 and into the pivot space (see 104 in FIG. 10). As edge 124 is moved toward surface 100, second edge 126 moves further into core space 26 and to a point where edge 126 will clear the adjacent end of finger member 14 (see FIG. 11). This movement is identified by arrow 128 in FIG. 10.

Figure 11:
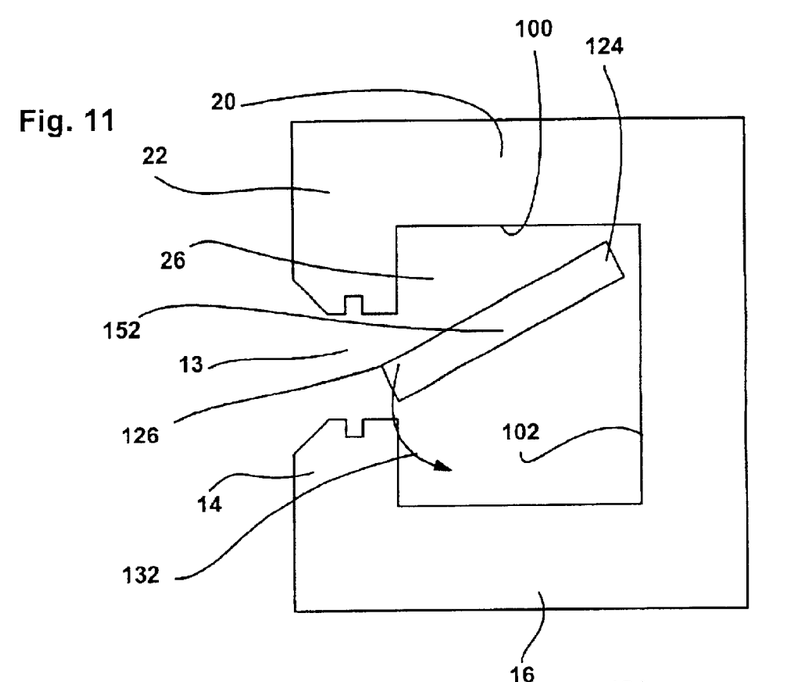
FIG. 11 is similar to FIG. 9 albeit illustrating one other step in an inventive method.
Figure 12:
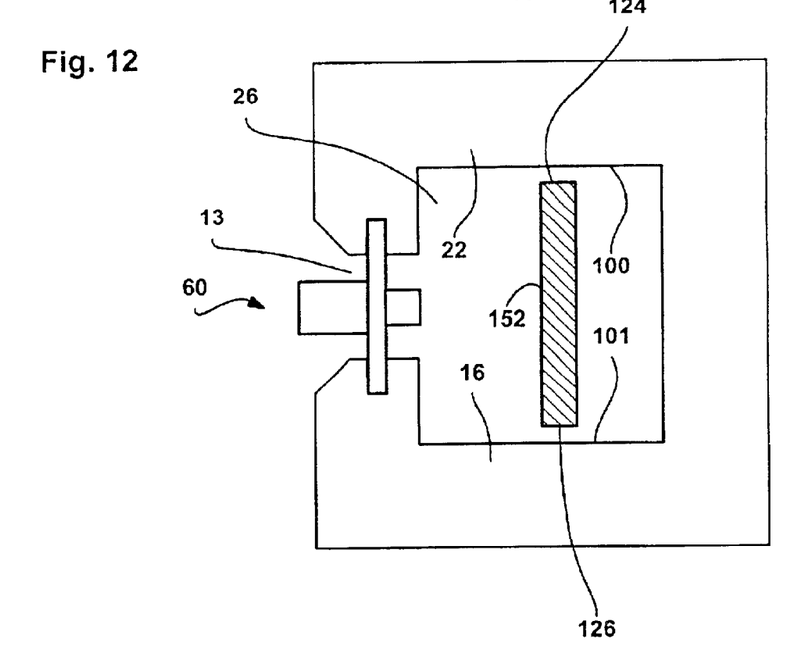
FIG. 12 is similar to FIG. 9 albeit illustrating yet one more step in an inventive method.

Continuing, at block 174, second edge 126 is rotated along the trajectory indicated by arrow 132 in FIG. 11 into core space 26. Thereafter, at block 176, central segment 152 is moved into its operating position as illustrated in FIG. 12. Finally, at block 178 sensing assembly 60 is mounted within gap 13 as illustrated in FIG. 12.

Figure 14:
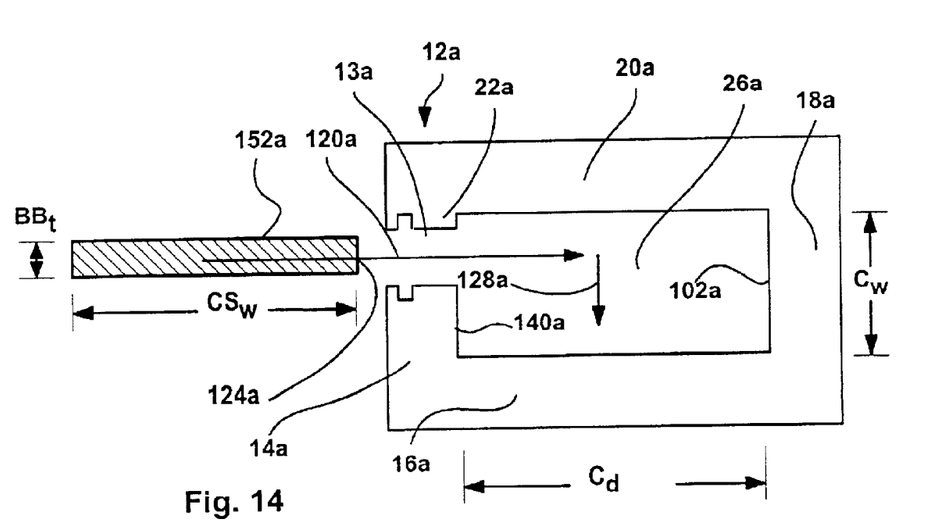
FIG. 14 is a side schematic view illustrating a portion of a second inventive method.
Figure 15:
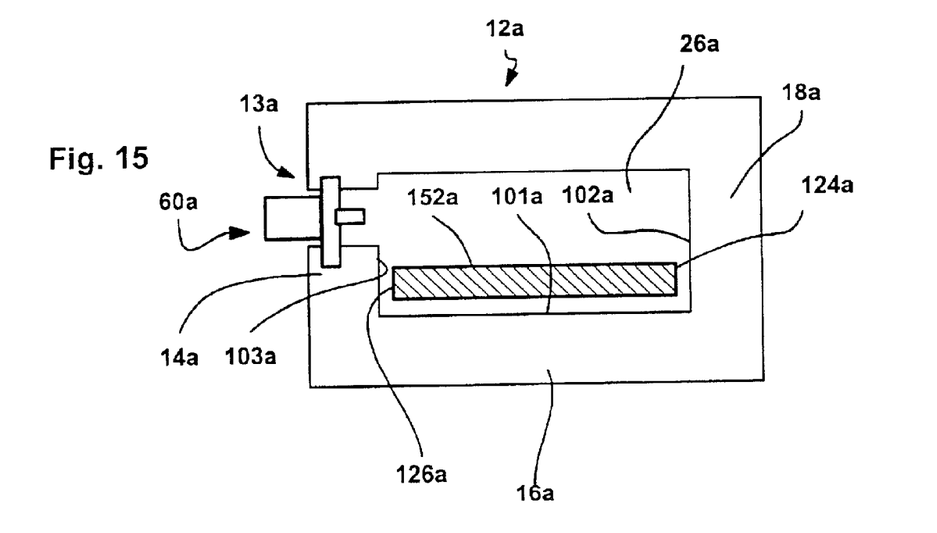
FIG. 15 is similar to FIG. 14 albeit illustrating a final configuration of the components illustrated in FIG. 14.

Referring now to FIGS. 14 and 15, a second embodiment of the present invention is illustrated. In FIGS. 14 and 15, many of the components are similar or substantially identical to the components described above with respect to the first embodiment and therefore will not be described again here in detail. Components in FIGS. 14 and 15 that are similar to those described above are identified by the same numerals followed by a lower case "a". For instance, the central segment referenced above by numeral 152 is referenced in FIGS. 14 and 15 by numeral 152a whereas the sensing assembly identified by numeral 60 above is identified in FIGS. 14 and 15 by numeral 60a.

Generally speaking, this second embodiment is different than the first embodiment only in that the form of the core 12a is different and the core form facilitates a slightly different, albeit similar, method to the method described above for locating central segment 152a within core space 26a. To this end, while core 12a still includes a shoulder member 18a, first and second arm members 16a and 20a and first and second finger members 14a and 22a, finger member 14a is relatively longer than finger member 20a such that the internal surface 140a of finger member 14a is longer than the thickness $BB_t$ of segment 152a. In addition, the depth $C_d$ of core space 26a between facing internal surfaces 140a and 102a is greater than the width $CS_w$ of central segment 152a. With core 12a so configured, segment 152a can be received between surfaces 140a and 102a such that a second edge 126a of member 152a is adjacent surface 140a.

In this second embodiment, to position central segment 152 within space 26a, segment 152a is aligned with gap 13a and is then slid or moved along the trajectory indicated by arrow 120a until first edge 124a is adjacent internal surface 102a. Next, segment 152a is moved along the trajectory indicated by arrow 128a (see FIG. 14) into the operating position illustrated in FIG. 15. Thereafter, sensing assembly 60a is mounted in gap 13a in the manner described above.

Referring now to FIGS. 12 and 15, it should be appreciated that the second embodiment illustrated in FIG. 15 results in an assembly where the core width $C_w$ is less than the width required for the embodiment illustrated in FIG. 12.

Figure 16:
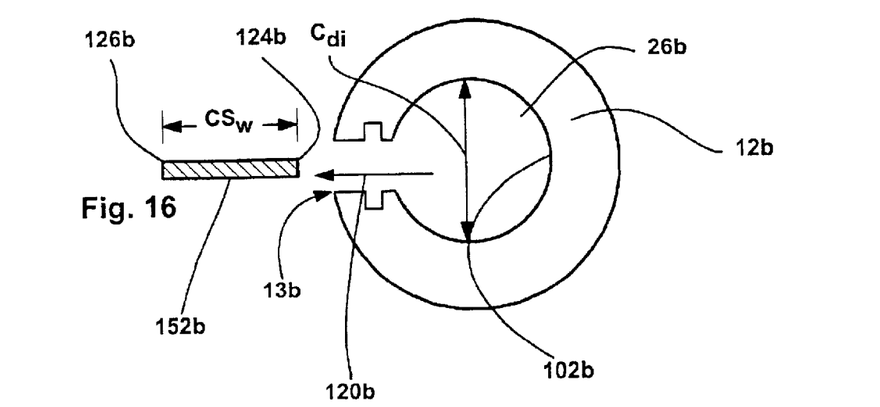
FIG. 16 is a side schematic view illustrating one step in a third method according to the present invention.
Figure 17:
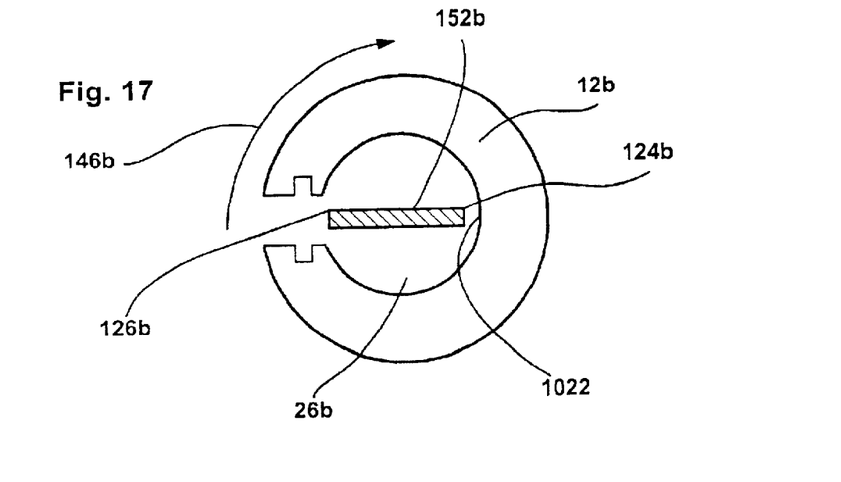
FIG. 17 is similar to FIG. 16, albeit illustrating another step in the third method according to the present invention.
Figure 18:
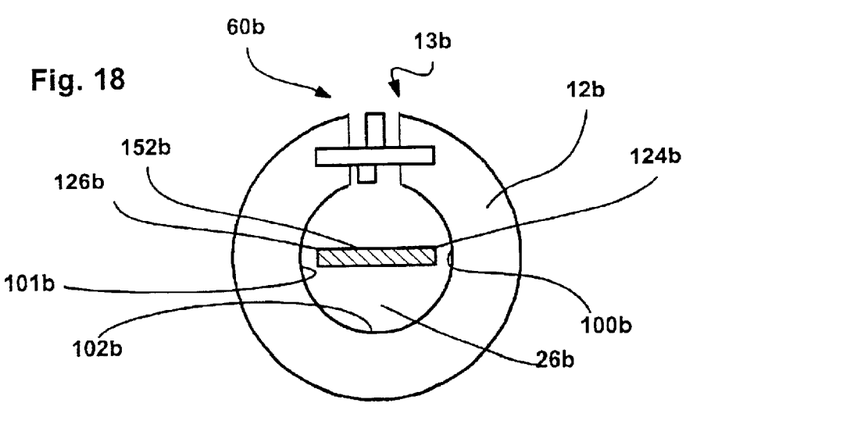
FIG. 18 is similar to FIG. 16, albeit illustrating a final configuration of components.

Referring now to FIGS. 16, 17 and 18, a third embodiment of the present invention is illustrated. As in the case of the second embodiment, in the case of this third embodiment, many of the components are similar to the components described with respect to the first embodiment and therefore, in the interest of simplifying this explanation, the similar components will not again be described here in detail. In FIGS. 16–18, components that are similar to the components described above are identified by a similar number followed by a lower case "b". For instance, the central segment in FIGS. 16–18 is identified by numeral 152b while the sensing assembly is identified by numeral 60b.

Referring specifically to FIG. 16, in this embodiment, the core 12b is annular forming a gap 13b and having an internal surface that form a diameter $D_d$ about a core space 26b. The diameter $C_{di}$ is greater than the central segment width $CS_w$ of segment 152b. The internal surface includes a limit surface or segment 102b opposite gap 13b and opposite segments 100b and 101b that flank segment 102b. Again, as above, the thickness of segment 152b is less than the smallest dimension across gap 13b. In this case, to position segment 152b within space 26b, core 12b is moved along the trajectory indicated by arrow 120b until segment 152b is completely within space 26b as illustrated in FIG. 17. Thereafter, core 12b can be rotated along the trajectory indicated by arrow 146b until the edges 124b and 126b of segment 152b are adjacent opposing surfaces 100b and 101b, respectively, and the segment 152b is in the operating position. As illustrated in FIGS. 17 and 18, according to one method, core 12b is rotated through approximately 90°.

While the first embodiment described above is described as one wherein the central segment 152 is moved and rotated and manipulated with respect to a stationary core 12, it should be appreciated that the motions described are relative and that, in many embodiments, instead of moving the segment 152 with respect to core 12, core 12 may in fact be moved with respect to segment 152. These relative motions are considered equivalent for the purposes of the present invention.

It should be appreciated that, while bar 122 is notched down to a smaller width along the relatively short central segment 152, the remainder of bar 122 is relatively wide (e.g., $BB_w$) and therefore bar heat is not appreciably increased by the notched segment 141 and 143 and the wide segments 150 and 154 help to dissipate heat that is generated by segment 152 as well as other segments.

As discussed above, sensor assembly size is an important design criteria and smaller size is generally desirable. Therefore, while core width $C_w$ is generally dictated by central segment width $CS_w$, to the extent possible core depth $C_d$ should be limited. Clearly, if core space 26 had to facilitate passage of wide end segment 154 or other end 150, depth $C_d$ would have to be relatively large. Instead of feeding bar 122 lengthwise through core space 26, it has been recognized that central segment 152 can generally be fed through gap 13 (see arrow 120 in FIG. 9) and into space 26 and that the depth $C_d$ required to facilitate this process is substantially minimized. The term "generally" is used to refer to the process of feeding segment 152 through gap 13 because, in fact, other manipulations are possible. For instance, bar 122 may be fed lengthwise through both gap 13 and space 26 with one edge of end segment 154 extending into and perhaps through gap 13 until central segment 152 is aligned with gap 31 at which point segment 152 may be moved further into space 26. Other machinations are contemplated to at least reach the point where the first edge 124 of segment 152 is adjacent surface 102 of shoulder member 18 in the intermediate position.

It has further been recognized that once segment 152 is in the intermediate position with first edge 124 adjacent surface 102 (see FIG. 10), the first edge 124 may be moved (see arrow 128 in FIG. 10) toward the internal surface 100 of member 20 along surface 102 thereby causing second edge 126 to move further into space 26. Thus, because second edge 126 moves further into space 26 during movement of edge 124 toward surface 100, central segment width $CS_w$ may actually be greater than core depth $C_d$ (see relative dimensions in FIG. 10) thereby further enabling reduction in depth $C_d$. Once second edge 126 is further inside space 26, edge 126 can be rotated past the end of finger member 14 (see arrow 132 in FIG. 11) and into space 26. After approximately 90° of rotation, segment 152 is aligned as illustrated in FIG. 12 with edges 124 and 126 adjacent surfaces 100 and 101, respectively. Thereafter, sensing assembly 60 can be inserted into space 11 as described above.

Referring again to FIGS. 1 through 5, it has also been recognized that the core 12 can be dimensioned such that a single clip 60 and a single sensor 94 can be used to sense currents of various magnitudes. To this end, as well known in the art, sensors like sensor 94 are designed to sense flux within a specific range and, if flux is outside the expected range, the sensor will not operate properly. In most applications the current that will pass through a conductor and to be sensed via the inventive assembly will be within an expected current range that can be anticipated. Also, as well known in the art, the amount of flux passing across a core gap given a specific current passing through a conductor that extends through the space 26 is related to the gap width $G_w$. Given a specific current magnitude, a large dimension $G_w$ reduces the flux passing between ends of core 12 while a smaller dimension $G_w$ increases the flux.

Thus, the sensing dimension of core 12 can be changed while employing a single clip/sensor configuration to enable the single clip/sensor configuration to be used to sense various current levels. For instance, given a first relatively low anticipated current magnitude within a first expected current range, a first core having a first relatively small sensing dimension $G_w$ may be employed so that the flux that results across the sensing dimension $G_w$ is within the sensor's optimal sensing range. Similarly, given a second relatively high anticipated current magnitude within a second expected current range, a second core having a second relatively large sensing dimension $G_w$ may be employed so that the flux that results across the sensing dimension is again within the sensor's optimal sensing range.

Importantly, to employ the same clip/sensor configuration in each of these two exemplary cases and in other exemplary cases for that matter, the gap passageway width $P_w$ formed by each of the cores would be identical. Thus, for instance, referring again to FIG. 5, in the example above, width $P_w$ would be identical for each of the first and second cores while width $G_w$ would be smaller for the first core (i.e., where the expected current magnitude is relatively low) than it would be for the second core (i.e., where the expected current magnitude is relatively high).

It should be understood that the methods and apparatuses described above are only exemplary and do not limit the scope of the invention, and that various modifications could be made by those skilled in the art that would fall under the scope of the invention. For example, the present invention may be useful where a single width conductor or bus bar is employed where ends of the bar are already attached to other components. In this case, the core can be manipulated over the bar without requiring detachment. As another example, referring to FIG. 8, instead of providing rectilinear notches 124 and 126, the notices in the bus bar may be sloped or radiused along edges 141 and 143 and the other facing edges.

To apprise the public of the scope of this invention, the following claims are made:

What is claimed is:

1. An apparatus for passing current and sensing magnetic field flux formed by the current, the apparatus comprising:
    a current conductor having a length that extends between first and second conductor ends and first and second edges that extend substantially along the entire conductor length, the edges forming first and second notches at a central conductor segment such that the central segment has a central width dimension that is less than the width dimensions of conductor segments adjacent thereto; and
    a rigid magnetically permeable guide core extending between facing first and second core ends and an internal surface formed about a core space, the first and second core ends defining a sensing gap having a gap dimension therebetween that is greater than the conductor thickness and less than the conductor width, the core including first and second member segments on opposite sides of the core space;
    wherein the central conductor segment is moveable through the gap and substantially into the core space with the conductor width aligned substantially perpendicular to the gap dimension and the core space is configured to allow the conductor, once substantially in the core space, to be moved into an operating position with the second member segment passing at least partially through the second notch and one of the first member segment and the gap passing at least partially through the first notch.

2. The apparatus of claim 1 wherein the conductor is in the operating position and the apparatus further includes a clip member mounted within the sensing gap and a flux sensor mounted to the clip member within the sensing gap.

3. The apparatus of claim 2 wherein the first member segment and at least one of the gap and the second member segment pass through the first and second notches, respectively.

4. The apparatus of claim 3 wherein the core includes front and rear surfaces and a core thickness therebetween, the length of the central segment is greater than twice the core thickness dimension.

5. The apparatus of claim 4 wherein the core is positioned approximately half way along the central segment.

6. The apparatus of claim 5 wherein the notches are substantially rectilinear.

7. The apparatus of claim 6 wherein the first and second opposite member segments form first and second internal surface segments and the first and second conductor edges are adjacent the first and second internal surface segments when the central segment is in the operating position.

8. The apparatus of claim 7 wherein the gap dimension is substantially perpendicular to the first and second internal surface segments.

9. The apparatus of claim 8 wherein the internal surface includes a limit surface on a side of the core space opposite the sensing gap and the sensing gap and the limit surface define a core depth that is less than the conductor width.

10. The apparatus of claim 9 wherein the core space further includes a pivot space adjacent to and open from the limit surface where a pivot dimension between the internal surface adjacent the pivot space and the first end of the core is greater than the conductor width such that when the first edge of the conductor is received within the pivot space, the second edge of the conductor is rotatable past the first end of the core and into the core space.

11. The apparatus of claim 9 wherein the first and second internal surface segments form a core width and the core width is substantially perpendicular to the core depth.

12. The apparatus of claim 11 wherein the first and second member segments are first and second substantially parallel arm members, respectively, and the core further includes a shoulder member and first and second finger members, each of the members being a substantially straight and elongated member and, wherein, the first and second parallel arm members extend to the same side and from opposite ends of the shoulder member to distal ends, the first and second finger members extend toward each other from the distal ends of the arm members and form the first and second ends of the core, the core forming a substantially rectilinear core space.

13. The apparatus of claim 12 wherein the first and second arm members define a receiving width and the shoulder member and each of the finger members define the core depth.

14. The apparatus of claim 13 wherein the conductor is positioned substantially centrally along the core depth.

15. A method for passing current and sensing magnetic field flux formed by the current, the method comprising the steps of:
    providing a current conductor having a length that extends between first and second conductor ends and first and second edges that extend substantially along the entire conductor length, the edges forming first and second notches at a central conductor segment such that the central segment has a central width dimension that is less than the width dimensions of conductor segments adjacent thereto; and
    providing a rigid magnetically permeable guide core extending between facing first and second core ends and an internal surface formed about a core space, the first and second core ends defining a sensing gap having a gap dimension therebetween that is greater than the conductor thickness and less than the conductor width, the core including first and second member segments on opposite sides of the core space;

moving the central conductor segment through the gap and substantially into the core space with the conductor width aligned substantially perpendicular to the gap dimension; and moving the central segment into an operating position with the second member segment passing at least partially through the second notch and one of the first member segment and the gap passing at least partially through the first notch.

16. The method of claim 15 further including the step of mounting a flux sensor within the gap after the central segment is in the operating position.

17. The method of claim 15 wherein the step of moving the central segment into the operating position includes rotating the conductor about an axis passing through the core space and substantially parallel to the length of the conductor.

18. The method of claim 17 wherein the step of rotating includes rotating substantially 90 degrees.

19. The method of claim 15 wherein the first and second member segments are elongated substantially straight members and the core further includes a shoulder member and first and second finger members, the first and second member segments are first and second substantially parallel arm members that extend to the same side and from opposite ends of the shoulder member to distal ends, the first and second finger members extending toward each other from the distal ends of the arm members and forming the first and second ends of the core such that the core forms a substantially rectilinear core space having a receiving width between the first and second arm members and a core depth perpendicular thereto, the core depth less than the conductor width, the step of moving the central segment through the gap including moving the central segment into a position with the first conductor edge proximate the shoulder member, the step of moving the central segment into the operating position including moving the first edge along the internal surface of the shoulder member toward the second arm member until the second edge of the conductor will clear the first end of the core and rotating the second edge of the conductor past the first end of the core and into the core space.

20. The method of claim 19 wherein the step of moving the central segment into the operating position includes the step of, after the second edge moves into the core space, rotating the conductor until the first and second edges of the conductor are proximate the first and second arm members.

* * * * *